United States Patent
Bent et al.

(10) Patent No.: US 9,170,279 B2
(45) Date of Patent: Oct. 27, 2015

(54) STATE MONITORING OR DIAGNOSTICS SYSTEM

(75) Inventors: Roland Bent, Detmold (DE); Johannes Kalhoff, Blomberg (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 182 days.

(21) Appl. No.: 14/125,998

(22) PCT Filed: Jun. 21, 2012

(86) PCT No.: PCT/EP2012/002618
§ 371 (c)(1),
(2), (4) Date: Dec. 13, 2013

(87) PCT Pub. No.: WO2012/175206
PCT Pub. Date: Dec. 27, 2012

(65) Prior Publication Data
US 2014/0132281 A1      May 15, 2014

(30) Foreign Application Priority Data
Jun. 21, 2011    (DE) .................... 10 2011 110 252

(51) Int. Cl.
*H01H 31/02*      (2006.01)
*G01R 1/36*      (2006.01)
(Continued)

(52) U.S. Cl.
CPC ...... *G01R 1/36* (2013.01); *G01R 23/02* (2013.01); *G06K 19/0717* (2013.01); *H01T 1/12* (2013.01)

(58) Field of Classification Search
CPC .............. G01R 23/145; G01R 27/32; G01N 2035/0427; G01N 1/36
USPC ......... 324/555, 633, 636, 600, 652, 675, 668, 324/682, 500, 149, 76.11; 438/14–18; 439/66–71, 372; 361/772, 774
See application file for complete search history.

(56) References Cited

U.S. PATENT DOCUMENTS 5,680,106 A  *  10/1997  Schrott et al. .............. 340/10.33
8,471,642 B2 *  6/2013   Hill ............................ 331/117 R (Continued)

FOREIGN PATENT DOCUMENTS

DE    10248640 A1    4/2004
EP    1172638 A1    1/2002
EP    1732242 A2    12/2006

OTHER PUBLICATIONS

English Translation of International Preliminary Report on Patentability, Serial No. PCT/EP2012/002618, Filing Date: Jun. 21, 2012, Applicant: Phoenix Contact GmbH & Co. KG, Date Mailed: Dec. 23, 2013.

(Continued)

*Primary Examiner* — Melissa Koval
*Assistant Examiner* — Trung Nguyen
(74) *Attorney, Agent, or Firm* — Reising Ethington PC

(57) ABSTRACT

The present disclosure concerns a state monitoring or diagnostics system, and also a method for monitoring the state of devices or for diagnosing devices, in particular for overvoltage protection devices, as well as a method for transmitting measured values. Each of the devices comprises a functional component to be monitored and a monitoring and transmitting apparatus, wherein the monitoring and transmitting apparatus consists solely of a resonator circuit made of passive electrical components with no microchip, in particular with no RFID transponder. The information to be interrogated resides in the resonant frequency of the resonator circuit.

16 Claims, 3 Drawing Sheets

(51) Int. Cl.
*G06K 19/07* (2006.01)
*H01T 1/12* (2006.01)
*G01R 23/02* (2006.01)

(56) References Cited

U.S. PATENT DOCUMENTS

| | | | |
|---|---|---|---|
| 8,542,023 B2* | 9/2013 | Potyrailo et al. | 324/652 |
| 2002/0021226 A1 | 2/2002 | Clement | |
| 2007/0105445 A1* | 5/2007 | Manto et al. | 439/620.09 |
| 2013/0105584 A1* | 5/2013 | Forster | 235/492 |

OTHER PUBLICATIONS

PCT International Search Report and Written Opinion Serial No. PCT/EP2012/002618 Int. Filing Date: Jun. 21, 2012.

German Office Action Dated: Feb. 29, 2012 Applicant: Phoenix Contact GmbH & Co. KG Re: DE 10 2011 110 252.7.

* cited by examiner

STATE MONITORING OR DIAGNOSTICS SYSTEM

TECHNICAL FIELD

The present disclosure concerns a state monitoring or diagnostics system and also a method for monitoring the state of devices or for diagnosing devices, for example for overvoltage protection devices, as well as a system and method for transmitting measured values.

BACKGROUND

Overvoltages are potentially disruptive factors that can cause damage or destruction in electrical equipment. For this reason, overvoltage protection devices are employed in many areas of electrical engineering, such as in electric power engineering, measurement, control, and regulation technology, information technology, and for transmitting and receiving facilities. Examples of this can be found at www.phoenixcontact.de/ueberspannungsschutz, for example.

Although overvoltage protection devices are designed to withstand high transient current loads, high-energy overvoltage interference can nevertheless overload the protection devices. When an overvoltage pulse occurs, it is possible for the pulse to be properly arrested by the overvoltage protection device although the overvoltage protection device is itself damaged by the event. Then, the overvoltage protection device may no longer function properly at the next occurrence of an overvoltage, and the electrical equipment may suffer damage that the overvoltage protection device is specifically intended to prevent. Consequently, the surge arresters are checked every so often so that the overvoltage protection measures are always effective. To this end, the overvoltage protection devices, which frequently are designed as replaceable modules, are removed from the system by the user and placed in a tester to be tested.

In addition, it is known from DE 10 2004 006,987 B3 to use RFID transponders for state monitoring and logging of overvoltage protection devices in order to permit remote interrogation. In this design, a known error detection unit is used that is read and interrogated through an RFID transponder. In the event of a fault in the overvoltage protection device, the error detection unit is caused to short-circuit or interrupt the transponder antenna circuit or to change the resonant frequency of the transponder antenna circuit.

However, the use of RFID transponders, especially in overvoltage protection devices, entails the risk that the RFID transponders themselves can be destroyed by an electromagnetic pulse. In this context, a problem with the method described in DE 10 2004 006 987 is that in some cases it may not be possible to identify whether the RFID transponder has been destroyed or whether the error detection unit has triggered. It is possible, namely, that the RFID transponder has been destroyed but that the overvoltage protection device itself is still functional. This can result in an unnecessary and costly replacement. In addition, RFID transponders have low electromagnetic compatibility (EMC), which is especially problematic for the stated applications. Apart from this, the use of RFID transponders is complicated and costly, which limits their use to relatively complex equipment.

GENERAL DESCRIPTION OF THE PRESENT DISCLOSURE

Therefore, the object of the present disclosure is to provide a state monitoring or diagnostics system, or a method for monitoring the state of devices or for diagnosing devices, that is simply constructed and economical.

Another object of the present disclosure is to provide a state monitoring or diagnostics system, or a method for monitoring the state of devices or for diagnosing devices, that has high electromagnetic compatibility and is insensitive, for example to overvoltages and electromagnetic pulses (known as EMP), especially to electromagnetic pulses from a lightning strike (known as LEMP).

A further object of the present disclosure is to provide a method for transmitting measured values that functions without its own electrical power supply and is simple and economical.

The object of the present disclosure is attained by the subject matter of the independent claims. Other embodiments of the present disclosure are defined in the dependent claims.

The basic concept of the present disclosure consists in that information is represented by the resonant frequency of a resonator circuit and is read out by electromagnetic excitation of the resonator circuit and measurement of the resonant frequency using the signal response. The signal response is the (decaying) electromagnetic resonant oscillation of the resonator circuit.

According to a first aspect of the present disclosure, a state monitoring or diagnostics system for devices, especially electronic and electromechanical devices, is provided. Each of the devices includes a functional component that is accommodated in the device's housing. This functional component can be an overvoltage protection component, for example, and is to be monitored with the present disclosure, although the present disclosure in its general form is not limited to the monitoring of overvoltage protection components.

The device also includes a monitoring and transmitting apparatus that monitors the functional component in the device and can transmit information about the current state of the functional component. In the simplest case, the information about the state may only be the binary information, namely that the functional component either is still functional or is possibly damaged. The information is interrogated by a reader that reads out the monitoring and transmitting apparatuses of the devices.

The monitoring and transmitting apparatus of each device consists solely of a resonator circuit made of passive electrical components in each case. Examples of passive electrical components are resistors (impedances), capacitors (capacitances), inductors (e.g., coils), and/or piezo elements. The monitoring and transmitting apparatus in this context does not contain any active components such as integrated semiconductor circuits (microchips). As the case may be, the monitoring and transmitting apparatus contains no RFID transponder or RFID chip, and hence there is no risk that these items could be disrupted or damaged in the case of an overvoltage, for example.

The resonator circuit is connected to the functional component to be monitored, which is located in the device housing, in such a manner that a change in the state of the functional component automatically causes a change in the resonant frequency or an interruption of the resonator circuit. As a result, the resonator circuit acts as a primitive information carrier for the state of the functional component in such a manner that the information on the current state of the functional component resides solely in the resonant frequency of the resonator circuit. In the simplest case of an interruption of the resonator circuit caused by an overvoltage, therefore, the presence of the resonant frequency and the absence resulting from the interruption represent a 1-bit piece of information on the function or possible malfunctioning of the functional component. This 1-bit piece of information is "stored" in the resonant circuit such that it can be electromagnetically interrogated in an appropriate manner.

The reader now interrogates the current resonant frequency of the resonator circuit in a contactless manner, for example on request by the user or at regular intervals, ascertains the current state of the functional component exclusively on the basis of the detected resonant frequency or the absence of a signal response from the resonator circuit, and indicates the ascertained state to the user.

The use of RFID transponders is quite deliberately avoided, which has the advantage that the monitoring and transmitting apparatus has high electromagnetic compatibility and, moreover, is extremely resistant to interference in general, e.g. from the electromagnetic pulses (EMP, especially LEMP) that unavoidably occur at an overvoltage protection device. The information to be interrogated is thus "stored" exclusively in the resonant frequency (value or presence) of the resonator circuit. Moreover, not only is it cost-effective to use the present disclosure with relatively expensive electrical equipment, but it is also so economical that the present disclosure can even be used with very simple "low cost products," such as with plug-in connectors, terminals, etc.

The information that is stored and can be interrogated in the resonator circuit is, for example, diagnostic, configuration, or status information on the functional component. An example of diagnostic information is the yes/no information (1-bit) as to whether the overvoltage protection (i) has not yet triggered or (ii) has already triggered and therefore should be replaced for safety reasons. However, more complex information can be "encoded" in the resonant frequency and interrogated, namely if the resonant frequency of the resonator circuit is adjustable. In this case, a specific item of information is associated with each resonant frequency.

A preferred embodiment of the present disclosure concerns, as explained above, diagnosis solely of whether the functional component remains undamaged or is possibly damaged and should be replaced. In other words, the information is preferably binary (1-bit) diagnostic information about the functional component. In this case, the resonator circuit has a first nominal resonant frequency in a normal state of the functional component, and, in a fault state, the resonator circuit is interrupted so that no signal response takes place on interrogation. Alternatively, this 1-bit information on the fault state can also be signaled by a second resonant frequency different from the nominal resonant frequency.

The reader ascertains (i) the presence of the normal state when the resonant frequency ascertained during interrogation matches the nominal resonant frequency and (ii) the presence of the fault state when the resonant frequency ascertained during interrogation differs from the nominal resonant frequency or when a signal response is absent, and indicates the ascertained normal or fault state.

To this end, the monitoring and transmitting apparatus is read out by the reader in that the reader generates an electromagnetic excitation signal with a defined frequency, for example the nominal resonant frequency, and excites the resonator circuit into oscillation therewith. The reader then receives the signal response of the resonator circuit to the excitation and uses the signal response to determine the current resonant frequency of the resonator circuit of the monitoring and transmitting apparatus in order to establish the state of the functional component in response to the ascertained resonant frequency or the absence of a signal response.

The monitoring and transmitting apparatus thus consists, for example, solely of an electrical resonant circuit comprising impedances, capacitances, inductors and/or piezo elements, all of which are passive electrical components that are very robust and economical. In the presence of the second state or fault state, the resonant circuit is either interrupted so that it can no longer produce a signal response, or its frequency is changed by action on the impedances, capacitances, inductors and/or piezo elements. For example, portions of the impedance, capacitance, inductor and/or piezo element can be disconnected from the resonant circuit by means of thermal or mechanical triggering so that the resonant frequency of the resonant circuit changes.

The resonant circuit is preferably excited by the reader, and its signal response to the excitation is received by the reader. Accordingly, the monitoring and transmitting apparatus does not require any electrical power to be supplied by the device to be monitored, and thus is self-sufficient in terms of energy. Consequently, the monitoring and transmitting apparatus still functions if the device no longer has an energy supply as a result of a fault event, and can be used for devices which themselves have no energy supply.

According to a preferred embodiment, the present disclosure is used for overvoltage protection devices. One example to which reference is made herewith is the applicant's "TRA-BTECH" product line (see www.phoenixcontact.de/ueberspannungsschutz). The functional component here is thus an overvoltage protection component. For overvoltage protection devices, the resonator circuit preferably includes a fuse. The fuse is connected to the overvoltage protection component in such a manner that when an overvoltage occurs that is arrested by the overvoltage protection component, the fuse in the device is tripped. The tripping of the fuse interrupts the resonator circuit or changes its resonant frequency by acting on the impedance, capacitance, inductor and/or piezo elements. The fuse is preferably a thermal fuse which burns through when tripped by the overvoltage, but a mechanically trippable fuse can also be provided.

The overvoltage is indeed safely arrested by the overvoltage protection component, but now it is possible to determine, using the present disclosure, whether an overvoltage protection device has arrested an overvoltage and if so, which device, with the determination being made in a contactless manner from outside by means of the electromagnetic response oscillations of the resonator circuits. The device need not necessarily be faulty, but the present disclosure makes it possible to replace the overvoltage protection device for safety reasons when it has triggered.

The resonator circuit and the device each may be equipped with mutually complementary plug-in contacts so that the monitoring and transmitting apparatus can be removably connected to the device. Accordingly, the user can himself decide which devices are to be equipped or, if applicable, retrofitted with the present disclosure by mounting the monitoring and transmitting apparatus on the device. In this case, the thermal fuse may be located in the device, more specifically in the housing of the device to be monitored, and to become a part of the resonator circuit when the plug-in connection between the resonator circuit and the device is connected. Consequently, the fuse becomes a part of the resonator circuit at plug-in, and then influences its resonant frequency as long as the fuse is intact. When the fuse burns through, the resonant frequency changes or the resonator circuit is interrupted.

In useful fashion, the resonator circuit includes two capacitors wired in parallel that are connected by means of the thermal fuse when the resonator circuit is mounted on the device. When the fuse burns through, one of the two capacitors is taken out of the resonator circuit thereby, changing the resonant frequency of the resonator circuit as a result.

So that the reader can be device-selective, or, in other words, so that only one particular device out of a plurality of devices to be monitored is interrogated, the transmitting and receiving range is chosen to be sufficiently short, for example, that the user must place the handheld device directly on the device to be interrogated in order to transmit the information, which is to say to excite the resonant circuit and receive the response signal. Nonetheless, although the present disclosure is very simple, it is not only possible to monitor a plurality of devices each having a monitoring and transmitting apparatus, but even to distinguish among them as well. In this case, a device identifier that can be interrogated in a contactless manner is defined exclusively by the nominal resonant frequency of the resonant circuit. In other words, the multiple monitoring and transmitting apparatuses of the different devices have different nominal resonant frequencies. The reader can thus distinguish different devices solely on the basis of the different nominal resonant frequencies. Accordingly, the user can himself set the nominal resonant frequencies of the resonator circuits, which is accomplished by means of dip switches, for example. In addition to the handheld device, a permanently installed transmitting and receiving device can also be used if it is located in the transmitting and receiving range of the devices.

However, it is not only possible to transmit information about the fault state of a device, which is typically only a 1-bit piece of information, but rather it is also possible to transmit more complex information, such as measured values, in a contactless manner. In this case, the devices each have a measuring apparatus for measuring a physical quantity and also each have a resonator circuit that consists solely of passive electrical components. Now, the resonator circuit is connected to the measuring apparatus in such a manner that the value of the quantity measured by the measuring apparatus influences the resonant frequency of the resonator circuit in a predetermined manner so that the resonant frequency of the resonator circuit is a continuous function of the measured value of the quantity. Consequently, a specific resonant frequency can be associated with a specific value of the quantity. For example, the capacitance of the resonant circuit has a dielectric that changes its dielectric constant as a function of the electric field. If such a capacitance is placed in the electric field of a current-carrying conductor, the amplitude of the current directly affects the resonant frequency of the resonant circuit. In general, the measured value acts on at least one tunable element of the resonant circuit (which is to say on the passive electrical components such as impedance, capacitance, inductor, or piezo element). The reader then reads, in an analog manner, the resonant frequency of the resonator circuit consisting exclusively of passive electrical components and ascertains the measured value of the quantity exclusively using the ascertained resonant frequency.

Below, the present disclosure is explained in detail using exemplary embodiments and with reference to the figures, wherein identical and similar elements are in part labeled with identical reference numbers, and the features of the various exemplary embodiments can be combined with one another.

BRIEF DESCRIPTION OF THE FIGURES

Shown are.

DETAILED DESCRIPTION

Figure 1:
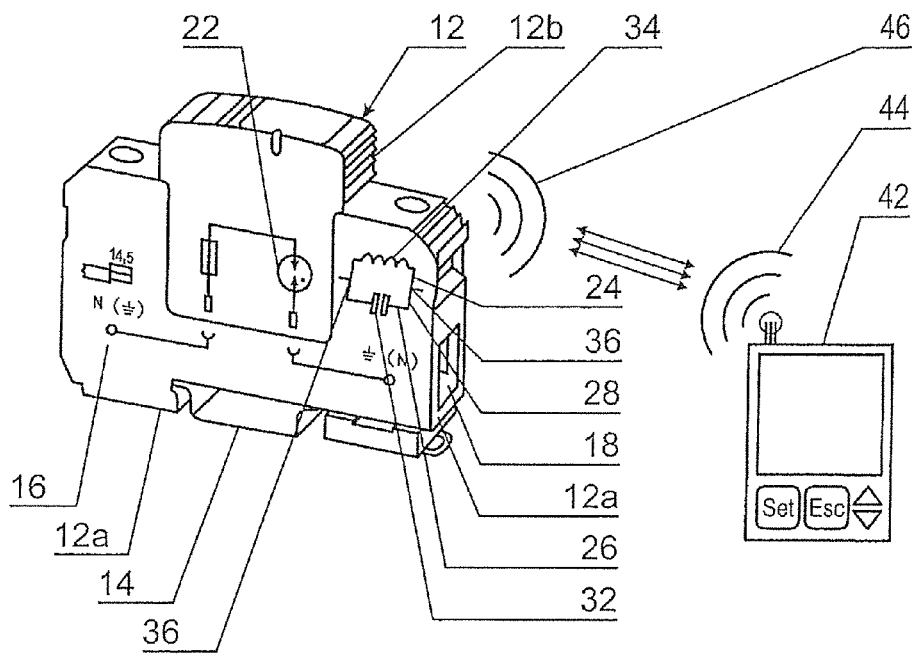
FIG. 1 a schematic representation of an overvoltage protection device with a resonator circuit and a handheld reader, FIG. 2 a schematic representation of the overvoltage protection device from FIG. 1 with a reader mounted on a top-hat rail, FIG. 3 a schematic representation of the overvoltage protection device from FIG. 1 with an enlarged detail of the resonator circuit, FIG. 4 a schematic representation of the connection of the resonator circuit to the overvoltage protection component, FIG. 5 a schematic representation of a plug-in resonator circuit with thermal fuse, and FIG. 6 a schematic representation of the transmission of a measured current value.

With reference to FIG. 1, an overvoltage protection device or overvoltage protection module 12 is mounted on a top-hat rail 14, typically in an equipment cabinet (not shown). The overvoltage protection module 12 has an input 16 and an output 18, and is constructed in two parts from two submodules 12a and 12b, wherein the submodule 12a is mounted on the top-hat rail and contains the overvoltage protection component 22. The submodule 12b is plugged in to the submodule 12a so that the submodule 12b can be replaced if necessary without the need to replace the submodule 12a. The overvoltage protection module 12 shown by way of example is part of the applicant's TRABTECH line. In this example, the overvoltage protection component 22 is implemented as a gas discharge arrester with a gas discharge tube and is symbolized on the side of the submodule 12a.

According to the present disclosure, the overvoltage protection module 12 has a resonator circuit 24 as a monitoring and transmitting apparatus 28, which likewise is symbolized on the module 12. The resonator circuit 24 consists solely of a simple electrical resonant circuit 26 with a resonant frequency. The resonant circuit consists solely of a capacitor 32, an inductor 34, and two impedances 36. In the condition at delivery, the resonant circuit 26 has a certain nominal resonant frequency $f_0$. The resonant circuit 26 is connected to the overvoltage protection component 22 in such a manner that when an overvoltage occurs, the overvoltage protection component 22 acts on the resonant circuit 26 in such a way that the circuit changes its resonant frequency, and hence no longer has the nominal resonant frequency $f_0$, but rather a changed resonant frequency $f' \neq f_0$. For the purpose of checking, the user, for example a service technician, uses a handheld reader 42 that transmits an electromagnetic excitation oscillation 44 with the nominal resonant frequency $f_0$. The excitation oscillation 44 excites the resonant circuit 26 at a short distance if the circuit is still capable of oscillation. The handheld reader 42 subsequently receives the signal response 46 of the resonant circuit 26 and ascertains the current resonant frequency $f$ of the resonant circuit 26 using the signal response 46.

In using a handheld reader 42 the service technician can bring the handheld reader 42 directly a short distance from the overvoltage protection module 12, and it is thus possible to determine, even in the case of multiple overvoltage protection modules 12 with identical nominal resonant frequencies $f_0$, which overvoltage protection module 12 still responds with $f_0$ and which does not because it has triggered.

Figure 2:
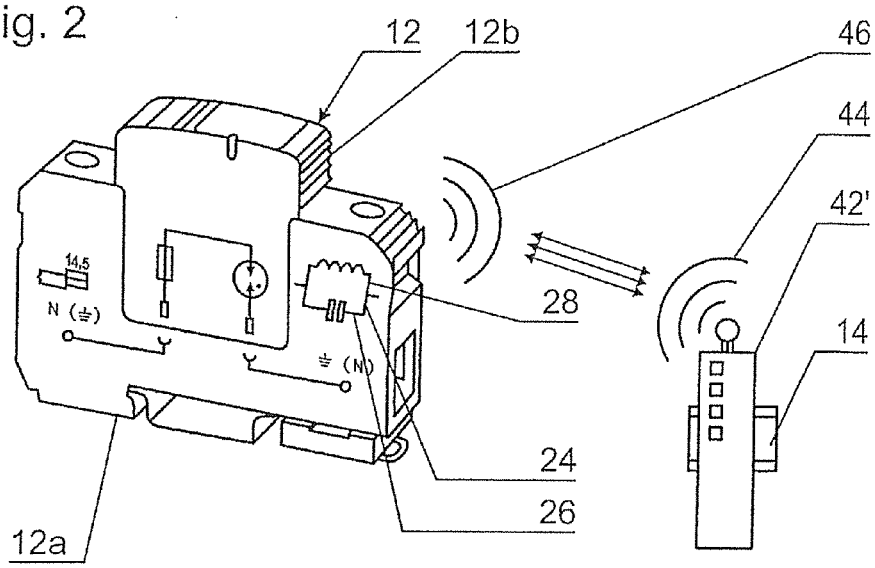

With reference to FIG. 2, a diagnostics system with a reader 42' is shown that is mounted on a top-hat rail 14 in an equipment cabinet, which is not shown. In this embodiment, the devices 12 are designed to be frequency-selective when multiple devices 12 to be monitored are present in the equipment cabinet, which is to say that different devices 12 have different nominal resonant frequencies $f_{01}$, $f_{02}$, $f_{03}$, etc., by which they can be distinguished.

Figure 3:
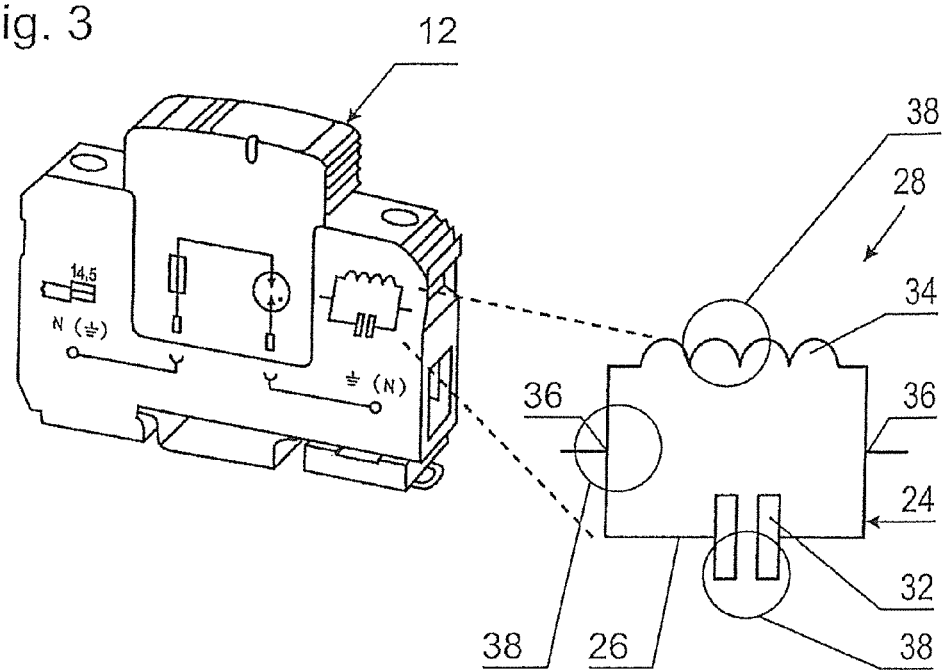

With reference to FIG. 3, an enlarged detail of the resonant circuit 26 is shown, which in this example is located in the submodule 12a. The resonant circuit 26 has multiple intervention points 38 at which the resonant frequency of the resonant circuit 26 can be changed, namely by changing the capacitance of the capacitor 32, the inductance of the coil 34, and/or the impedance(s) 36.

Figure 4:
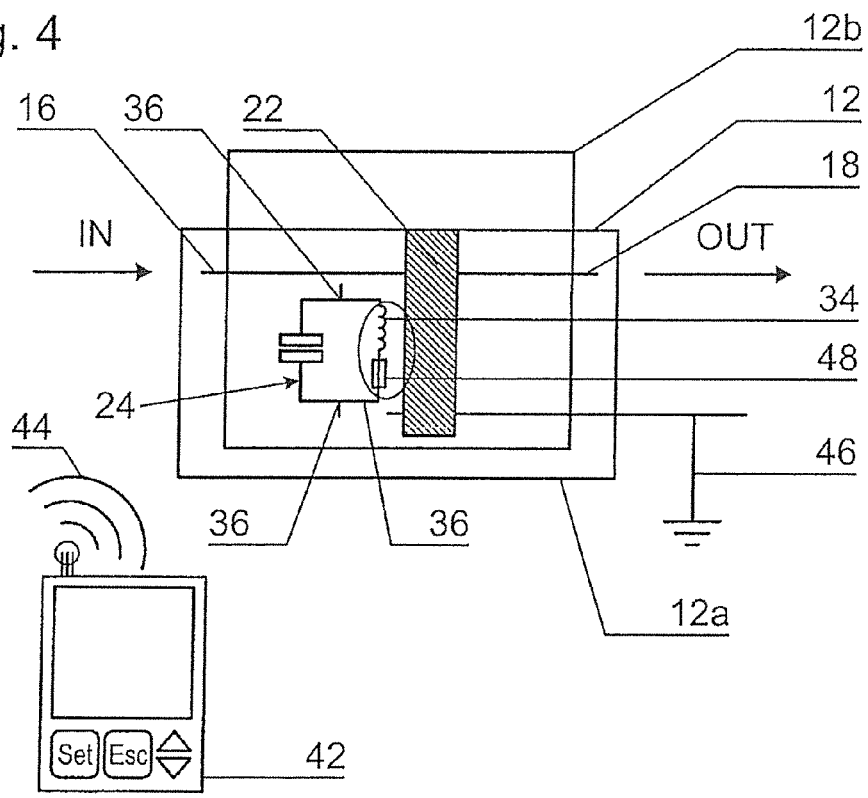

With reference to FIG. 4, an exemplary embodiment for the connection of the resonant circuit 26 to the overvoltage protection component 22 is shown. The overvoltage protection component 22 diverts an overvoltage to ground 46. The resonant circuit 26 includes a thermal fuse 48 in the resonant circuit 26, in the region of the coil 34 in this example. When the overvoltage protection component 22 diverts an overvoltage to ground, the thermal fuse 48 trips by means of the electromagnetic pulse induced in the coil and interrupts the resonant circuit 26. Subsequent to this, the handheld reader 42 can be used once again to ascertain the circumstance that the resonant frequency is no longer present.

Figure 5:
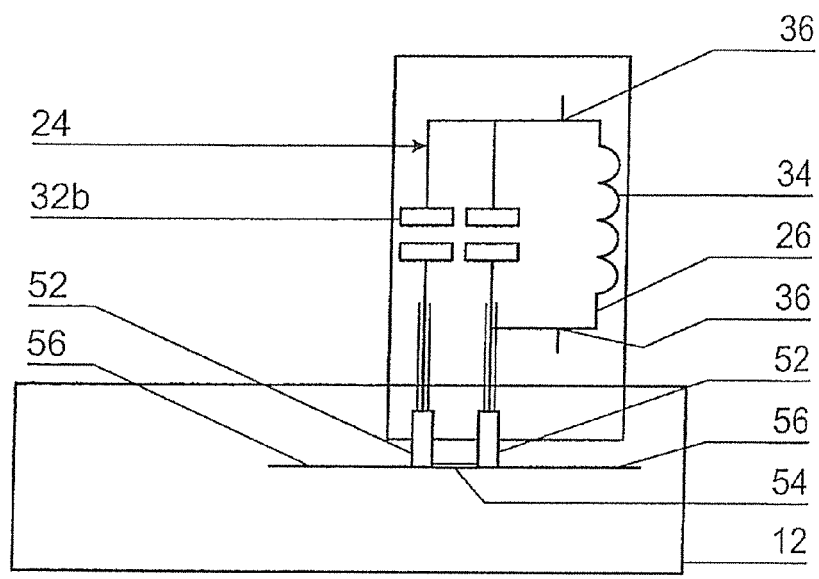

With reference to FIG. 5, a diagnostics system with a resonator circuit 24 mounted on the device 12 is shown. The resonator circuit 24 and the device 12 have mutually complementary plug-in contacts 52. When the resonator circuit 24 is in the mounted state, a section 54 of the conductive trace 56 of the device 22 connects two capacitors 32a and 32b that are wired in parallel. The section 54 of the conductive trace 56 is configured as a fuse element, and is severed in the event of a device fault, for example thermally due to the effects of an overvoltage. Severing the fuse element 54 causes the second capacitor 32b to be removed from the resonant circuit 26 with the result that the resonant frequency of the resonant circuit 26 changes accordingly from $f_0$ to $f' \neq f_0$.

Alternatively, a capacitive change can also take place through thermal action on the dielectric.

In another embodiment of the resonator circuit 24, the circuit has a temporary energy storage device (not shown) that temporarily stores in a suitable storage medium, for example a capacitor, a coil, or the like, energy brought in from outside by means of the reader or interrogation signal (known as energy harvesting). This energy can be used to prolong transmission of the response signal 46 in terms of time. In this way, improved signal quality is achieved, which in turn simplifies the receiving electronics in the reader 42, since less resonance interference occurs in the receive spectrum.

If multiple devices, for example overvoltage modules 12, are used in the same environment, for example within an equipment cabinet, the different devices 12 in the equipment cabinet have resonant circuits 26 that each have a different nominal resonant frequency $f_{01}$, $f_{02}$, $f_{03}$, etc. In this way, the reader 42 can unambiguously associate the signal response 46 with a specific device 12. In the simplest case, all nominal resonant frequencies $f_{01}$, $f_{02}$, $f_{03}$, etc. are interrogated, and the reader 42 indicates the particular devices 12 that responded with the associated nominal resonant frequency and accordingly are functional, and/or indicates the particular devices 12 that did not provide a signal response and consequently may be faulty and should be replaced.

The devices 12 can either be configured at the factory by fixed delivery or as a function of a production setting, for example type number, article number, or serial number. This means that the nominal resonant frequency $f_0$ is either predetermined at the factory, or the nominal resonant frequency of the resonator circuits 24 is designed to be configurable. Configurable devices 12 can be encoded, e.g., mechanically, for example using switches or by breaking off sections of the circuit board, or by changing pressure, resistance, dielectric constant, and/or inductance. However, the change in the nominal resonant frequency can also be accomplished through a parameterization interface, for example software with a connection to the device through a network, so that the user can tune the applicable resonant circuit 26 himself.

In addition to the overvoltage protection application explained by way of example above, possible applications for the present disclosure also include modular terminals, measuring terminals, or measurement connectors, for example each with a status diagnosis of the connected signal. In the case of a measuring terminal or measurement connector, moreover, it is possible to measure electrical quantities such as current or voltage and/or physical quantities such as temperature, etc., and transmit them to the reader 42 by means of the signal response 46 with the resonant frequency of the resonant circuit, as will be explained below.

Figure 6:
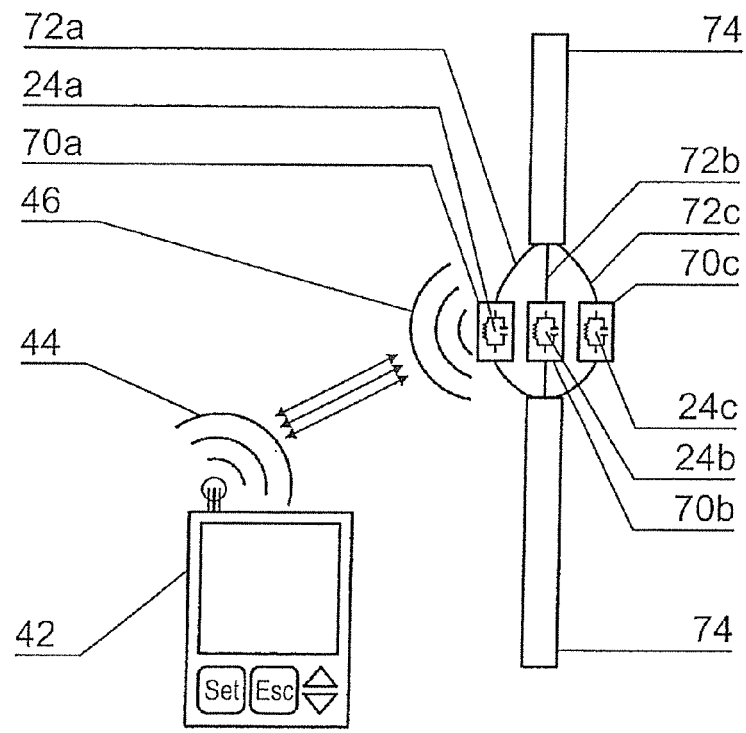

With reference to FIG. 6, three electrical measuring terminals 70a, 70b, 70c are built into a wiring harness 74, for example. Each of the measuring terminals 70a, 70b, 70c connects a conductor 72a, 72b, 72c of the wiring harness 74, and each has a resonator circuit 24a, 24b, 24c in accordance with the present disclosure, wherein their resonant frequencies $f_1$, $f_2$, $f_3$ can be tuned in a continuously variable manner. The frequency ranges $F_1$, $F_2$, $F_3$ of the resonant frequencies $f_1$, $f_2$, $f_3$ of the resonant circuits 24a, 24b, 24c of the three measuring terminals 70a, 70b, 70c are chosen such that they do not overlap, so that the handheld operating device 42 can distinguish the three resonator circuits 24a, 24b, 24c by the applicable resonant frequency $f_1$, $f_2$, $f_3$. At the measuring terminals 70a, 70b, 70c, a voltage measurement is undertaken without a reference voltage by utilizing nonlinear effects in the electric field, which is generated by the supply current. The capacitors of the resonant circuits 26a, 26b, 26c each have a dielectric made of a material whose dielectric constant $\in$ is dependent on the electric field strength, so that the capacitors each have a capacitance dependent on the current. This current-dependent capacitance, in turn, results in a current-dependent resonant frequency f(I) of the resonant circuits 26a, 26b, 26c. Consequently, the reader 42 can interrogate the value for the current in each of the measuring terminals 70a, 70b, 70c independently of one another, by measuring the applicable resonant frequency $f_1(I)$, $f_2(I)$, $f_3(I)$ of the resonant circuits 26a, 26b, 26c, and relate the applicable measured value to the associated measuring terminal.

In summary, the device to be monitored can change the frequency of the resonant circuit in a predetermined manner, for example through a temperature change, size change, media change, or pressure change, or through switching elements/spring tension. The resonator circuit can contain piezo elements, coils, capacitors, or electrically acting dielectrics. These items form a resonant circuit and contain at least one resonant circuit element that can be influenced from the outside. In a simple case, a resonant circuit element can be taken out of the circuit or short-circuited by the device. The resonator circuit thus generates different response frequencies that correspond to items of diagnostic, configuration, or status information. As a response signal, the resonator circuit returns its impressed nominal resonant frequency or the changed frequency. By means of the service technician's reader, the returned frequency is received, evaluated, and made accessible for further processing, for example as a diagnostics display.

It is evident to one skilled in the art that the embodiments described above should be considered as examples and that the invention is not limited thereto, but instead can be varied in multiple ways without departing from the invention. Furthermore, it is evident that, regardless of whether the features are disclosed in the description, claims, figures, or elsewhere, they also define parts of the present disclosure singly, even if they have been described in combination with other features.

For example, the features of the monitoring or diagnostics system, the features of the system for transmitting measured data, and the system and method features can be combined with one another.

The invention claimed is:

1. State monitoring or diagnostics system for devices,
    wherein the devices each include a monitoring and transmitting apparatus to monitor a functional component in the relevant device and to transmit information about the current state of the functional component,
    wherein a reader for contactless readout of the monitoring and transmitting apparatuses is included,
    wherein the monitoring and transmitting apparatuses each consist solely of a resonator circuit made of passive electrical components,
    wherein the resonator circuit is connected to the functional component to be monitored, which is built into the device, in such a manner that a change in the state of the functional component automatically causes a change in the resonant frequency (f) or an interruption of the resonator circuit, so that the resonator circuit acts as an information carrier for the state of the functional component in such a manner that the information on the applicable state of the functional component resides solely in the resonant frequency (f) of the resonator circuit, and
    wherein the reader interrogates the current resonant frequency of the resonator circuit and ascertains the current state of the functional component using the detected resonant frequency or using the absence of a signal response from the resonator circuit.

2. State monitoring or diagnostics system according to claim 1, wherein the information is a piece of diagnostic, configuration, or status information on the functional component.

3. State monitoring or diagnostics system according to claim 2, wherein the information is diagnostic information on the functional component, and the resonator circuit has a first nominal resonant frequency ($f_0$) in a normal state of the functional component, and in a fault state has a second resonant frequency (f') different from the nominal resonant frequency or is interrupted, and the reader
    (i) ascertains the presence of the normal state when the resonant frequency ascertained during interrogation matches the nominal resonant frequency, and
    (ii) ascertains the presence of the fault state when the resonant frequency ascertained during interrogation differs from the nominal resonant frequency or when a signal response is absent.

4. State monitoring or diagnostics system according to claim 1, wherein the monitoring and transmitting apparatus is read out by the reader in that the reader excites the resonator circuit into oscillation by means of an electromagnetic excitation signal and uses the signal response to determine the current resonant frequency of the resonator circuit of the monitoring and transmitting apparatus in order to establish the state of the functional component in response to the ascertained resonant frequency or the absence of a signal response.

5. State monitoring or diagnostics system according to claim 1, wherein the monitoring and transmitting apparatus consists solely of an electrical resonant circuit comprising impedances, capacitors, inductors, and/or piezo elements.

6. State monitoring or diagnostics system according to claim 5, wherein, in the presence of the fault state, the resonant circuit is interrupted, or its frequency is changed by action on the impedances, capacitances, inductors, and/or piezo elements of the resonant circuit.

7. State monitoring or diagnostics system according to claim 1, wherein the monitoring and transmitting apparatus is self-sufficient in terms of energy, and does not have any electrical power supplied by the device being monitored.

8. State monitoring or diagnostics system according to claim 1, wherein the functional component is an overvoltage protection component, and the resonator circuit includes a fuse, wherein the fuse is connected to the overvoltage protection component in such a manner that when an overvoltage occurs in the device, the fuse is tripped, wherein the resonator circuit is interrupted or its resonant frequency (f) is changed by means of the tripping.

9. State monitoring or diagnostics system according to claim 1, wherein the resonator circuit and the device have complementary plug-in contacts so that the monitoring and transmitting apparatus can be removably connected to the device.

10. State monitoring or diagnostics system according to claim 9, wherein the device comprises a thermal fuse that is located in the device and that becomes a part of the resonator circuit when the plug-in connection between the resonator circuit and the device is connected, so that the fuse influences the resonant frequency of the resonator circuit when the fuse is intact, and the fuse changes the resonant frequency (f) of the resonator circuit when the fuse burns through in the plugged-in state.

11. State monitoring or diagnostics system according to claim 10, wherein the resonator circuit includes two capacitors wired in parallel that are connected by means of the thermal fuse when the resonator circuit is mounted on the device, and wherein one of the two capacitors is taken out of the resonator circuit when the thermal fuse burns through, changing the resonant frequency (f) of the resonator circuit as a result.

12. State monitoring or diagnostics system according to claim 1, comprising a plurality of devices, each having a monitoring and transmitting apparatus, wherein the monitoring and transmitting apparatuses of the devices have different nominal resonant frequencies ($f_{01}$, $f_{02}$, $f_{03}$) and the reader can distinguish the different devices on the basis of the different nominal resonant frequencies ($f_{01}$, $f_{02}$, $f_{03}$).

13. State monitoring or diagnostics system according to claim 1, wherein the nominal resonant frequency ($f_0$) of the resonator circuit can be set by the user.

14. Method for monitoring the state of devices or for diagnosing devices, wherein the devices each include a functional component to be monitored and a monitoring and transmitting apparatus in order to be able to store and interrogate a piece of information about the functional component, wherein the monitoring and transmitting apparatus consists solely of a resonator circuit made of passive electrical components,
    wherein a functional state is associated with the resonant frequency (f) of the resonator circuit,
    wherein the resonant frequency (f) of the resonator circuit is automatically changed by the functional component or the resonator circuit is interrupted,
    wherein the resonator circuit is electromagnetically excited by a reader, and the reader uses the signal response of the resonator circuit to determine the current resonant frequency thereof, and
    wherein the reader ascertains the functional state of the functional component using the detected resonant frequency of the resonator circuit or the absence of a signal response from the resonator circuit.

15. System for the measurement and contactless transmission of measured values, comprising at least a device with a measuring apparatus for measuring a physical quantity and a reader,
- wherein the device has a resonator circuit that consists solely of passive electrical components,
- wherein the measuring apparatus for measuring the physical quantity is connected to the resonator circuit in such a manner that the value of the quantity measured by the measuring apparatus influences the resonant frequency ($f_1$, $f_2$, $f_3$) of the resonator circuit in a predetermined manner so that the resonant frequency ($f_1$, $f_2$, $f_3$) of the resonator circuit is a function of the measured value of the quantity,
- wherein the resonator circuit can be electromagnetically excited by the reader, and the reader uses the signal response of the resonator circuit to determine its current resonant frequency, and
- wherein the reader has means for determining the current value of the quantity using the ascertained resonant frequency of the resonator circuit.

16. Method for the contactless transmission of measured values from devices to a reader,
- wherein the devices each have a measuring apparatus for measuring a physical quantity,
- wherein the devices each have a resonator circuit that consists solely of passive electrical components,
- wherein the measuring apparatus is connected to the resonator circuit in such a manner that the value of the quantity measured by the measuring apparatus influences the resonant frequency ($f_1$, $f_2$, $f_3$) of the resonator circuit in a predetermined manner so that the resonant frequency ($f_1$, $f_2$, $f_3$) of the resonator circuit is a function of the measured value of the quantity,
- wherein the resonator circuit is electromagnetically excited by the reader, and the reader uses the signal response of the resonator circuit to determine the current resonant frequency thereof, and
- wherein the reader ascertains the current value of the quantity using the detected resonant frequency of the resonator circuit and the function stored in the measuring apparatus.

* * * * *